(12) United States Patent
Cai

(10) Patent No.: US 7,842,968 B2
(45) Date of Patent: Nov. 30, 2010

(54) INTEGRATED LOW LEAKAGE DIODE

(75) Inventor: Jun Cai, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 456 days.

(21) Appl. No.: 11/971,596

(22) Filed: Jan. 9, 2008

(65) Prior Publication Data
US 2009/0173966 A1    Jul. 9, 2009

(51) Int. Cl.
  *H01L 29/43*    (2006.01)
(52) U.S. Cl. .................. 257/139; 257/140; 257/141; 257/144; 257/557; 257/E27.015
(58) Field of Classification Search ............ 257/139, 257/140, 141, 144, 557, E27.015
See application file for complete search history.

(56) References Cited

U.S. PATENT DOCUMENTS

| | | | |
|---|---|---|---|
| 4,117,507 A | 9/1978 | Pacor | |
| 6,005,283 A | 12/1999 | Kim et al. | |
| 6,034,413 A | 3/2000 | Hastings et al. | |
| 6,110,767 A | 8/2000 | Wu | |
| 7,045,830 B1 | 5/2006 | Cai et al. | |
| 7,285,828 B2 | 10/2007 | Salcedo et al. | |
| 2006/0118814 A1 | 6/2006 | Cai | |

OTHER PUBLICATIONS

International Search Report of corresponding PCT Application No. PCT/US08/088595, dated Jun. 24, 2009, 2 pages.

*Primary Examiner*—Tan N Tran
(74) *Attorney, Agent, or Firm*—Thomas R. Fitzgerald, Esq.; Hiscock & Barclay, LLP

(57) ABSTRACT

An integrated low leakage diode suitable for operation in a power integrated circuit has a structure similar to a lateral power MOSFET, but with the current flowing through the diode in the opposite direction to a conventional power MOSFET. The anode is connected to the gate and the comparable MOSFET source region which has highly doped regions of both conductivity types connected to the channel region to thereby create a lateral bipolar transistor having its base in the channel region. A second lateral bipolar transistor is formed in the cathode region. As a result, substantially all of the diode current flows at the upper surface of the diode thereby minimizing the substrate leakage current. A deep highly doped region in contact with the layers forming the emitter and the base of the vertical parasitic bipolar transistor inhibits the ability of the vertical parasitic transistor to fully turn on.

10 Claims, 5 Drawing Sheets

INTEGRATED LOW LEAKAGE DIODE

FIELD OF THE INVENTION

This invention relates power integrated circuit devices and, more particularly, to high voltage diodes in power integrated circuits.

BACKGROUND OF THE INVENTION

The background for this invention is found in the Description of the Related Art section of U.S. Pat. No. 7,045,830.

SUMMARY OF THE INVENTION

The present invention comprises in one embodiment thereof a diode formed integrally with a power integrated circuit on a substrate of a first conductivity type, having an epitaxial layer of the first conductivity type formed on the substrate with a first region of a second conductivity type opposite the first conductivity type in the epitaxial layer separated from the substrate, and a second region of the first conductivity type on above and contacting the first region such that a vertical parasitic transistor is formed spanning the epitaxial layer, the first region and the second region. The diode further includes a gate oxide on the epitaxial layer and a gate on the gate oxide, a channel region of the first conductivity type under the gate and which extends to a third region of the first conductivity type having a higher dopant concentration than the channel region, and a fourth region of the second conductivity type contacting the channel region and the third region and is substantially aligned vertically with a first edge of the gate; the fourth region having a higher dopant concentration than the channel region. The diode further includes an anode terminal in contact with the gate, the third region, and the fourth region, a drift region of the second conductivity type extending from the channel region to a fifth region of the second conductivity type and a sixth region of the first conductivity type, the drift region having a lower dopant concentration than the fourth region, the fifth and sixth regions having higher dopant concentrations than the channel region, a cathode terminal in contact with the fifth and sixth regions, and a seventh region of the second conductivity type extending from the upper surface of the epitaxial layer downward to the first region which makes contact with the first and second regions and the third region, the seventh region having a higher dopant concentration than the first and second regions, the seventh region in contact with the anode terminal.

In another form of the present invention a diode formed integrally with a power integrated circuit on a substrate of a first conductivity type includes an epitaxial layer of the first conductivity type formed on the substrate, a first region of a second conductivity type opposite the first conductivity type in the epitaxial layer separated from the substrate, and a second region of the first conductivity type on above and contacting the first region such that a vertical parasitic transistor is formed spanning the epitaxial layer, the first region and the second region. The diode also includes a gate oxide on the epitaxial layer and a gate on the gate oxide, a channel region of the first conductivity type under the gate and which extends to a third region of the first conductivity type having a higher dopant concentration than the channel region, and a fourth region of the second conductivity type contacting the channel region and the third region and is substantially aligned vertically with a first edge of the gate, the fourth region having a higher dopant concentration than the channel region. The diode also includes an anode terminal in contact with the gate, the third region, and the fourth region, a drift region of the second conductivity type extending from the channel region to a fifth region of the second conductivity type and a sixth region of the first conductivity type, the drift region having a lower dopant concentration than the fourth region, the fifth and sixth regions having higher dopant concentrations than the channel region, a cathode terminal in contact with the fifth and sixth regions, and an eighth region of the first conductivity type between and contacting the second region and the drift region.

The present invention also comprises in one embodiment thereof a diode formed integrally with a power integrated circuit on a substrate of a first conductivity type including an epitaxial layer of the first conductivity type formed on the substrate, a first region of a second conductivity type opposite the first conductivity type in the epitaxial layer separated from the substrate, and a second region of the first conductivity type on above and contacting the first region such that a vertical parasitic transistor is formed spanning the epitaxial layer, the first region and the second region. The diode further includes a stepped gate oxide on the epitaxial layer having a thinner section and a thicker section, a gate on the stepped gate oxide overlapping both the thinner section and the thicker section of the gate oxide, a channel region of the first conductivity type under the thinner section of the stepped gate oxide and the gate which extends to a third region of the first conductivity type having a higher dopant concentration than the channel region, and a fourth region of the second conductivity type contacting the channel region and the third region and is substantially aligned vertically with a first edge of the gate; the fourth region having a higher dopant concentration than the channel region. In addition the diode includes an anode terminal in contact with the gate, the third region, and the fourth region, a drift region of the second conductivity type extending from the channel region to a fifth region of the second conductivity type and a sixth region of the first conductivity type, the drift region having a lower dopant concentration than the fourth region, the fifth and sixth regions having higher dopant concentrations than the channel region, and a cathode terminal in contact with the fifth and sixth regions.

In still another form of the present invention a method is provided for reducing parasitic substrate leakage current in a diode formed integrally with a power integrated circuit, the diode including a parasitic vertical transistor through which the parasitic substrate leakage current flows, the method comprising connecting a region which forms a base of the parasitic vertical transistor to a region which forms an emitter of the parasitic vertical transistor with a highly doped region which is connected to an anode terminal of the diode.

BRIEF DESCRIPTION OF THE DRAWINGS

The aforementioned and other features, characteristics, advantages, and the invention in general will be better understood from the following more detailed description taken in conjunction with the accompanying drawings, in which.

Figure 1:
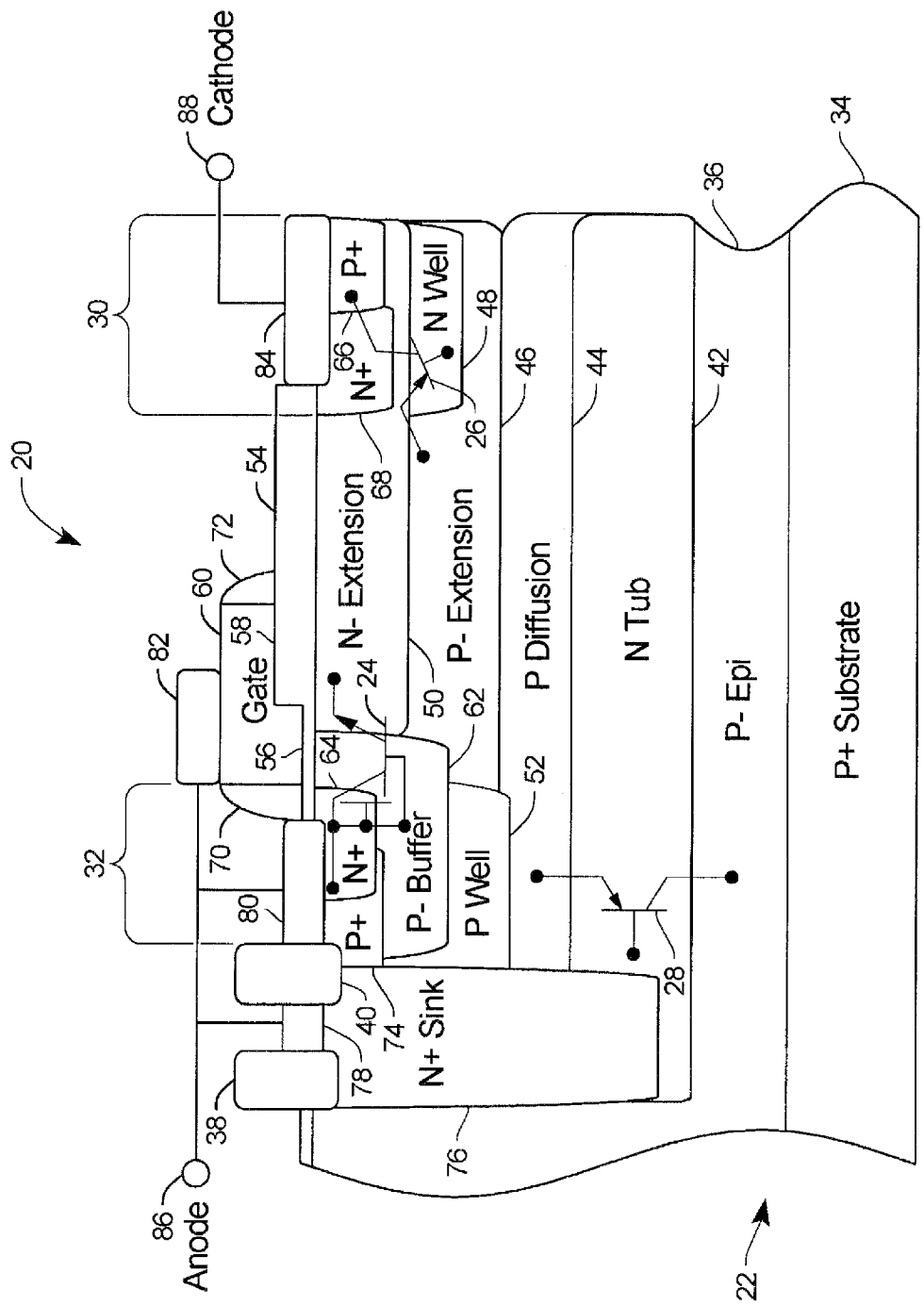
FIG. 1 is a diagrammatical view of an integrated low leakage diode according to one embodiment of the present invention.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

FIG. 1 is a diagrammatical view of an integrated low leakage diode 20 which can be formed in a power integrated circuit 22. Also shown in FIG. 1 are schematical depictions of three bipolar transistors which are inherent in the diode 20, a lateral NPN transistor 24, a lateral PNP transistor 26, and a vertical parasitic PNP transistor 28.

The diode 20 may be considered a modified N channel power MOSFET for purposes of understanding the structure of the diode 20. In the normal conductive state of a conventional N channel power MOSFET, the source, located adjacent the gate, is more negative than the drain which is located on the side of the drift region away from the gate, and electrons flow from the source to the drain. In the diode 20, however, the cathode region 30 is in the position of the drain in the conventional MOSFET, and the anode region 32 is in the position of the source in the conventional MOSFET resulting in current flowing in the opposite direction in the diode 20 with respect to the conventional MOSFET.

The power integrated circuit 22 has a P+ substrate 34 on which a P− epitaxial layer 36 has been grown. It will be understood that the conductive types described and shown in FIG. 1 may all be reversed if they are all reversed resulting in an N+ substrate, an N− epitaxial layer, etc.

For a better understanding of the structure of the diode 20, the description below generally follows the processing operations used to form the diode 20. Therefore, the location of various regions may be in relation to regions previously formed in the manufacturing process rather than to the regions in the completed diode 20 shown in FIG. 1. The diode 20 includes field oxides 38 and 40 formed in the upper surface of the epitaxial layer 36 near what will be the anode region 32 of the diode 20. An N tub 42 is formed in the epitaxial layer 36 and has a depth of approximately 2 microns and a dopant concentration of approximately 1e16 to 1e18 atoms per cubic centimeter. A P diffusion 44 having a depth of approximately 1.25 microns and a dopant concentration of approximately 6e15 to 6e17 atoms per cubic centimeter formed on the top of the N tub 42. A P− extension 46 having a depth of approximately 1 microns and a dopant concentration of approximately 6e15 to 6e17 atoms per cubic centimeter is formed on the P diffusion 44. An N well 48 having a depth of approximately 0.8 microns and a dopant concentration of approximately 5e16 to 8e17 atoms per cubic centimeter is placed in an upper section of the P− extension under what will be the cathode region 32 in the completed diode 20. An N− extension 50 having a depth of approximately 0.4 microns and a dopant concentration of approximately 3e16 to 3e18 atoms per cubic centimeter is formed on the P− extension 46 and extends vertically to the upper surface of the epitaxial layer 36. The stacked P− extension 46 and the N− extension 50 in the drift region enable the diode 20 to withstand a high voltage reverse bias and a relatively low on resistance through the drift region because of the RESURF design of the P− extension 46 and the N− extension 50.

A P well 52 having a depth of approximately 1 microns and a dopant concentration of approximately 5e16 to 8e17 atoms per cubic centimeter is formed in the anode region 32 and extends downward into the P diffusion 44.

A step gate oxide 54 having a thinner section 56 of approximately 115 A microns in depth, and a thicker section 58 having a depth of approximately 425 A microns is formed on the surface of the epitaxial layer 36, and a gate 60 is formed on the step gate oxide 54 and extends over the thinner section-thicker section transition of the step gate oxide 54. The thicker section 58 of the step gate oxide 54 minimizes the Miller feedback capacitance along with reducing the sensitivity of the diode 20 to hot carrier injection (HCI) effects due to reduced electrical field between cathode region 32 and the gate 60.

A P− buffer 62 having a depth of approximately 0.8 microns and a dopant concentration of approximately 6e16 to 6e18 atoms per cubic centimeter and an N+ region 64 having a depth of approximately 0.1 microns and a dopant concentration of approximately 1e19 to 9e20 atoms per cubic centimeter are formed in the anode region 32 using the gate 60 as a mask. The P− buffer 62 extends downward to about the middle of the P− extension 46, and under the portion of the gate 60 over the thinner section 56 of the step gate oxide 54, thus forming a short channel region under the gate 60 of approximately 0.1 to 0.35 microns. The N+ region 64 extends down partially into the P− buffer 62 and is self-aligned with the edge of the gate 60.

A P+ region 66 having a depth of approximately 0.2 microns and a dopant concentration of approximately 5e18 to 5e20 atoms per cubic centimeter is formed in the N− extension 50 in the right side of the cathode region 30, i.e., the side farthest from the gate 60, and an N+ region 68 having a depth of approximately 0.2 microns and a dopant concentration of approximately 1e19 to 9e20 atoms per cubic centimeter is also formed in the N− extension 50, but in the left side of the cathode region 30 and adjacent to the P+ region 66.

Gate sidewall oxides 70 and 72 are formed on the sides of the gate 40, and a P+ region 74 having a depth of approximately 0.2 microns and a dopant concentration of approximately 5e18 to 5e20 atoms per cubic centimeter is formed self-aligned with the sidewall oxide 70 in the anode region 32, and extends downward into the P− buffer 62. The lower dopant concentration of the P+ region 74 does not significantly affect the N+ region 64. An N+ sink 76 having a dopant concentration of approximately 1e18 to 1e20 atoms per cubic centimeter is formed between and partially under the field oxides 38, 40 and extends down into the N tub 42. The highly doped N+ sink 76, which contacts both the P diffusion region 44 and the N tub 42, reduces the forward bias between the two regions and prevent the vertical parasitic PNP transistor 28 from fully turning on.

Four silicides are formed on the exposed surfaces of the epitaxial layer 36. The first silicide 78 makes contact to the N+ sink 76, the second silicide 80 makes contact with the P+ region 74 and the N+ region 64, the third silicide 82 makes contact with the gate 60, and the fourth silicide 84 makes contact with the N+ region 68 and the P+ region 66. Silicides 78, 80, and 82 are connected together and to an anode terminal 86 of the diode 20. Silicide 84 is connected to a cathode terminal 88 of the diode 20.

Figure 6A:
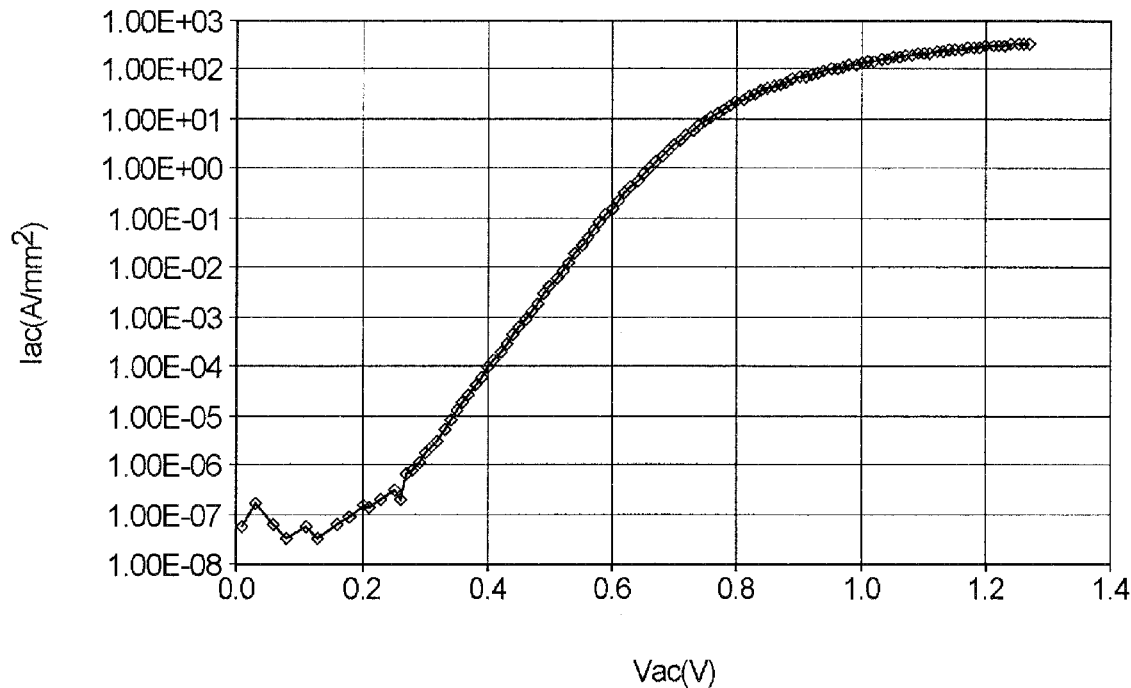
FIGS. 6A and 6B are plots of the measured voltage drop across the diode versus diode current of two integrated low leakage diodes of the type shown in FIG. 1.
Figure 6B:
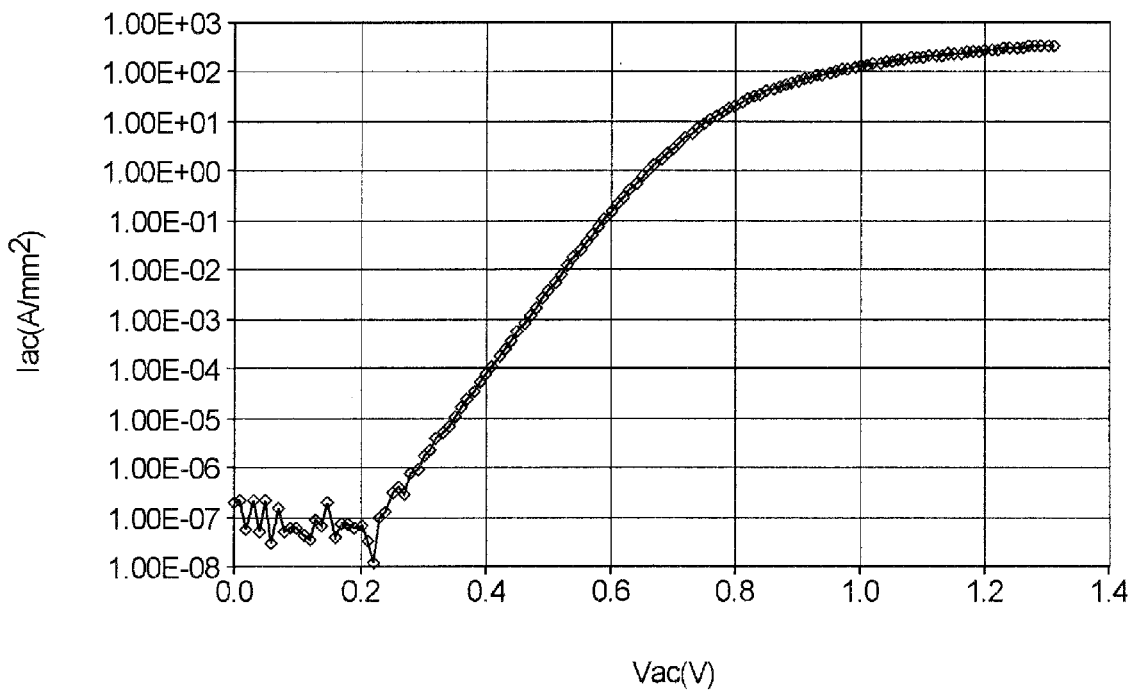

The diode 20 therefore has a P conductivity type path from the anode terminal 86 to the channel region under the gate 60 which is also connected to the anode terminal 86. Therefore, without the presence of the lateral NPN transistor 24, there would not be an inversion layer induced in the channel region and there would not be any current flow through the diode 20 when the anode to cathode voltage is less than a PN forward biased junction barrier voltage. However, when the anode to cathode voltage becomes greater than the PN forward biased junction barrier voltage, about 0.7 volts, the lateral NPN transistor 24 becomes conductive because there is a hole current in the base flowing from P buffer 62 to N− extension 50 and electron current collected by N+ region 64 from N− extension 50, the electron current in the surface will reduce the surface barrier to form an inversion layer in the channel region and, finally, the reversed MOSFET with drain N+ 64 and source N+ 68, is turned-on at a lower threshold voltage. The part of electron channel current of the reversed MOSFET will become the base current of the gate control NPN because there are exchanges between hole carriers and electron carriers in the silicide layer 80. The diode 20 therefore operates in a hybrid MOS-bipolar mode resulting in relatively high current through the diode 20 with relatively low forward voltage as shown in FIGS. 6A and 6B. The efficiency of the low forward voltage drop of the short channel gate control lateral NPN transistor 24 is much greater than the vertical parasitic PNP transistor 28, therefore, the current from anode 86 to cathode 88 will be much greater than the current from the anode to substrate, and the substrate leakage arising from the vertical parasitic PNP transistor 28 will be significantly reduced.

The lateral PNP transistor 26 in the cathode region 30 having both its base in the N well 48 and its collector in the P+ region 66, and its emitter in the P− extension 46 results in another bipolar connection between the anode terminal 86 and the cathode terminal 88. There is a voltage difference between the surface of N+ region 68 to the area of N well 48 underneath P+ region 66 due to the voltage drop in the N well resistor, therefore, the junction between P+ region 66 and N well 48 is reversed-bias. At a higher anode voltage which is enough to forward-bias the P− extension 46 to N well 48 junction, the lateral PNP transistor 26 will be turned-on, which also reduces the substrate leakage arising from the vertical parasitic PNP transistor 28 due to more anode hole current going laterally to the cathode rather than going vertically to the substrate.

Since the hole current in the anode region 32 will mostly recombine with electron current near the surface from the N− extension region 50, and the lateral bipolar transistors 24, 26 are much more powerful than that vertical parasitic PNP transistor 28, the vertical hole current flow will be much less than the surface hole current flow thereby reducing the beta of the vertical parasitic PNP transistor 28.

In addition, all of the regions in the diode 20 are formed using standard power IC technology.

Figure 2:
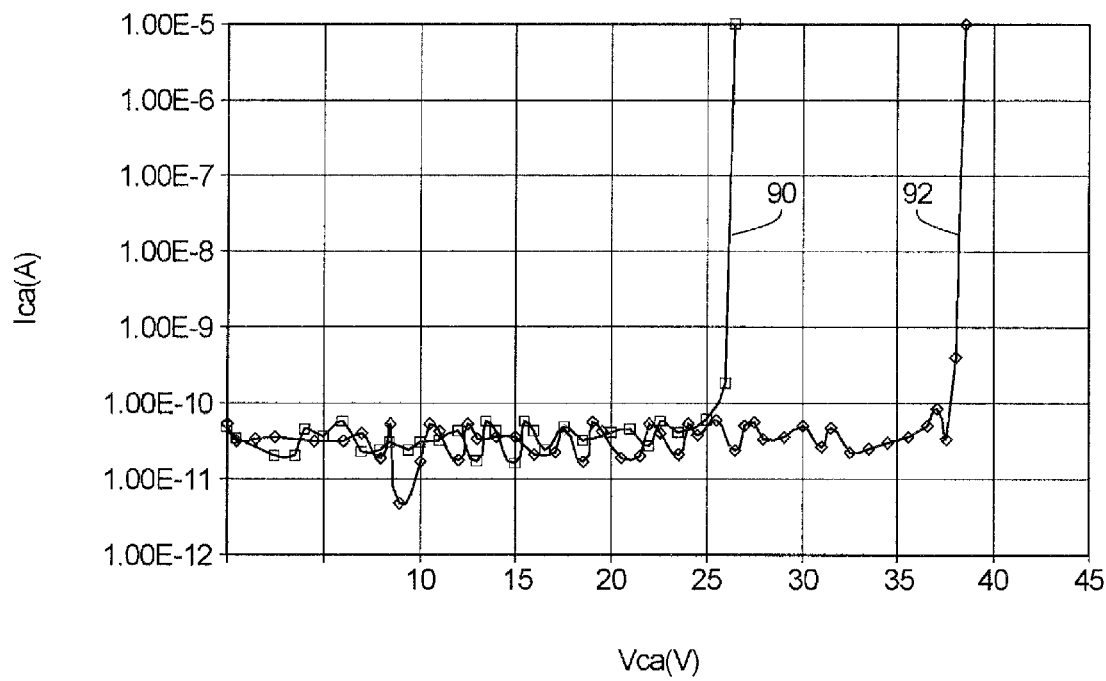
FIG. 2 is a plot of the measured breakdown voltages of two integrated low leakage diodes of the type shown in FIG. 1.
Figure 3:
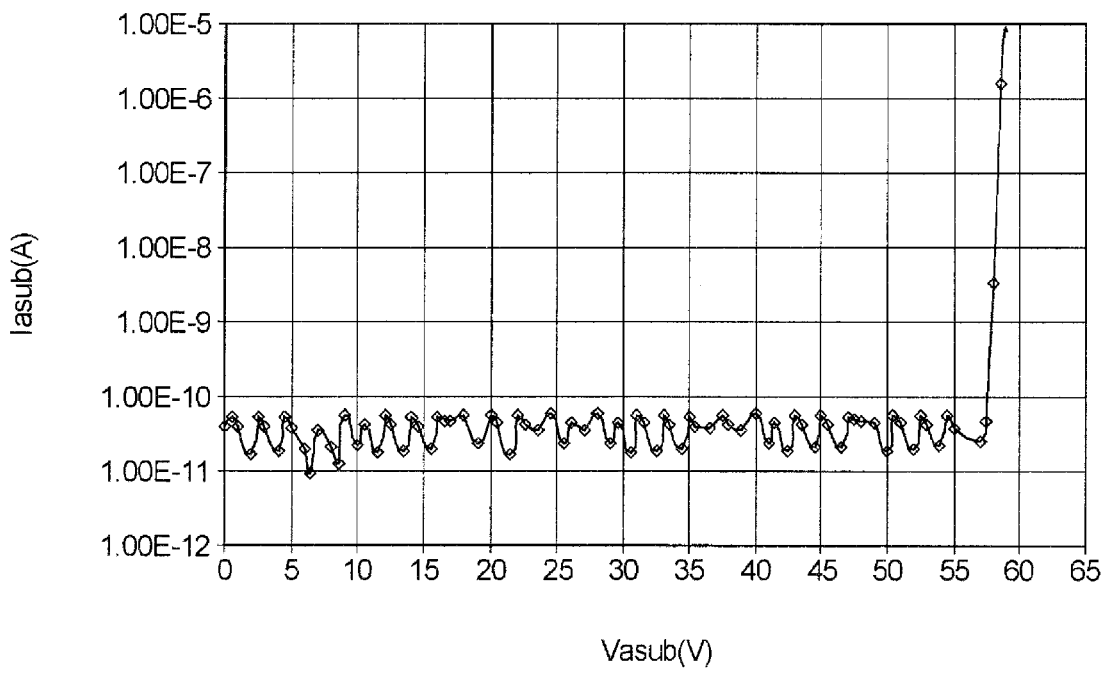
FIG. 3 is a plot of the measured anode to substrate breakdown voltage of an integrated low leakage diode of the type shown in FIG. 1.

FIG. 2 is a plot of the measured breakdown voltages 90 and 92 of integrated low leakage diodes 20 having rated breakdown voltages of 20 volts and 30 volts, respectively. The 20 volt device breakdown voltage, shown as curve 90, has a breakdown voltage of 26.5 volts, and the 30 volt device breakdown voltage, shown as curve 92, has a breakdown voltage of 38.5 volts FIG. 3 is a plot of the measured anode to substrate breakdown voltage of an integrated low leakage diode of the type shown in FIG. 1. As can be seen, the anode to the substrate breakdown is around 59 volts.

Figure 4A:
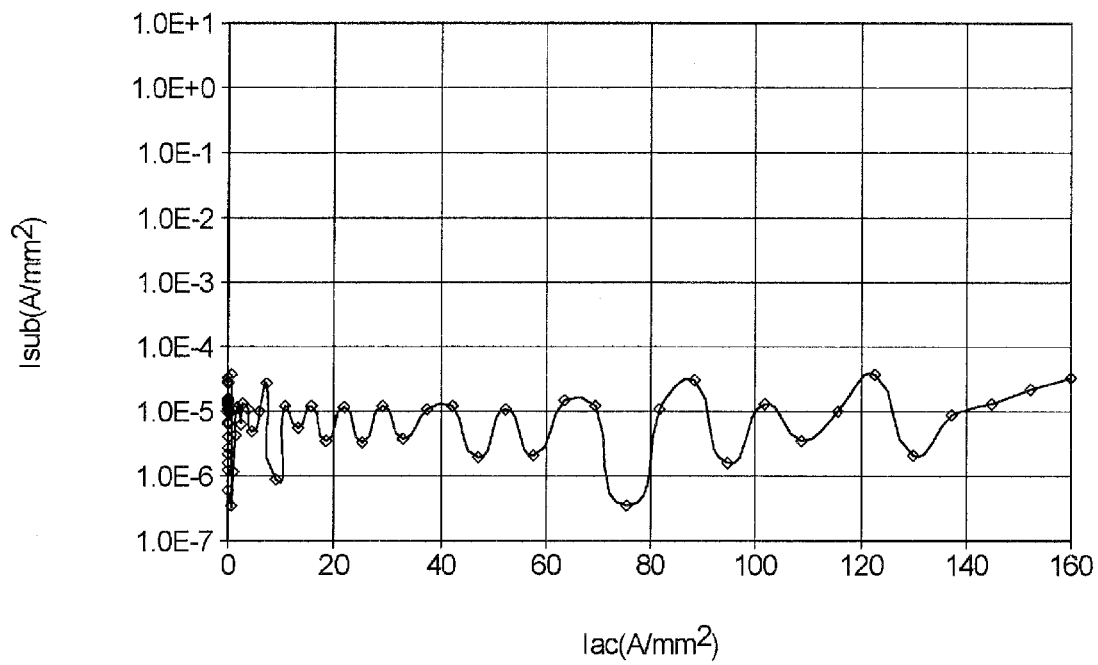
FIGS. 4A and 4B are plots of the measured substrate current versus diode current of two integrated low leakage diodes of the type shown in FIG. 1.
Figure 4B:
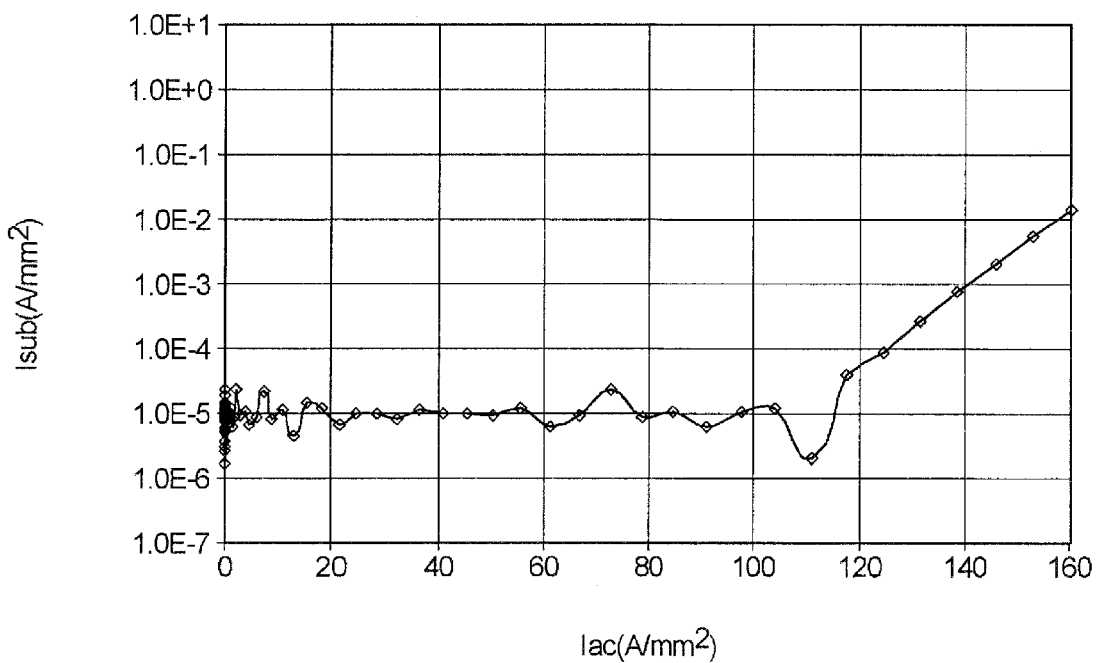

FIGS. 4A and 4B are plots of the measured substrate current versus diode current of two integrated low leakage diodes of the type shown in FIG. 1. As shown in FIG. 4A, there is very low substrate current for the 20 volt device, even at an anode current density of 160 A/mm$^2$, while the 30 volt device, shown in FIG. 4B, also has a very low substrate current at the same current density.

Figure 5A:
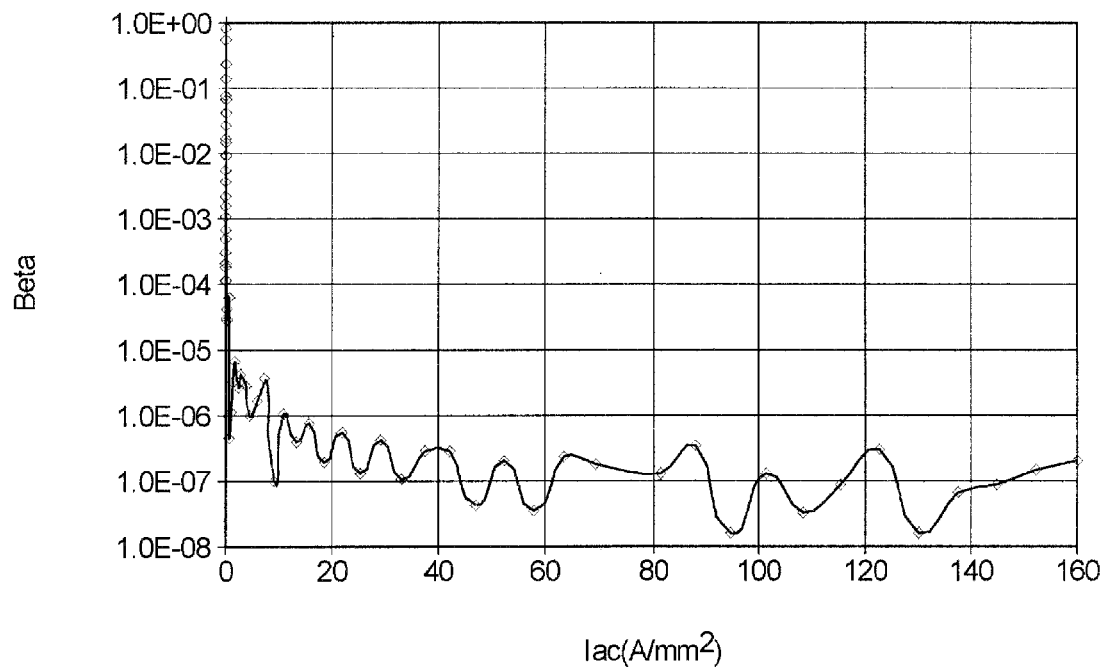
FIGS. 5A and 5B are plots of the measured betas of the parasitic PNP vertical transistors versus diode current of two integrated low leakage diodes of the type shown in FIG. 1.
Figure 5B:
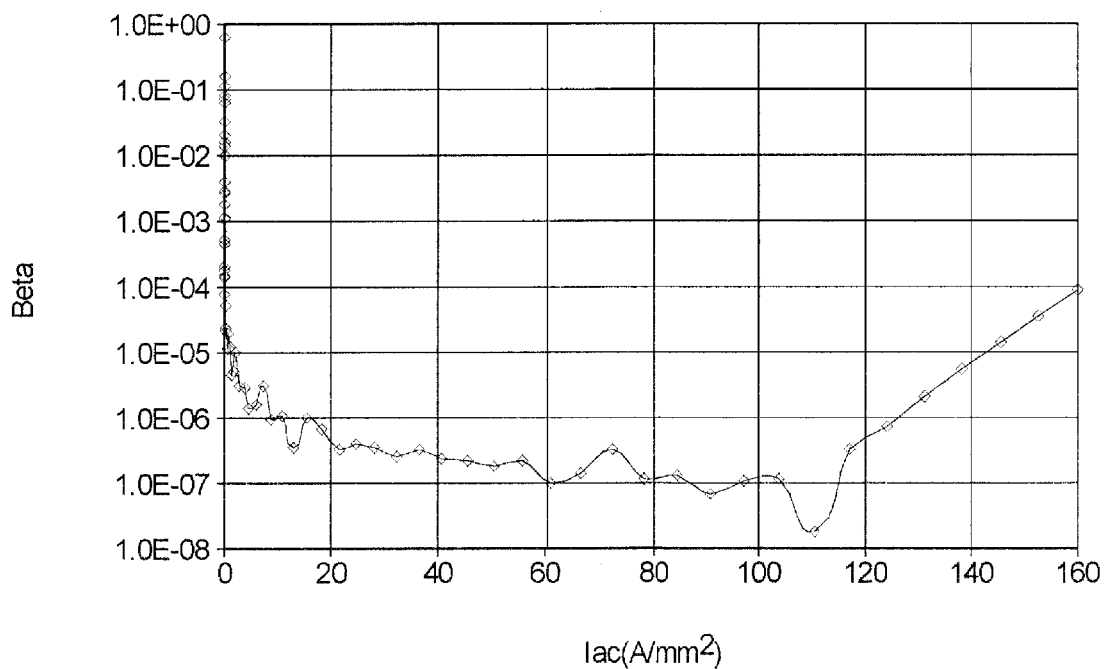

FIGS. 5A and 5B are plots of the measured betas of the parasitic PNP vertical transistors 28 versus diode current of two integrated low leakage diodes of the type shown in FIG. 1. FIG. 5A shows a beta for the vertical parasitic PNP transistor 28 of around 2.1E−7 for the 20 volt device at an anode current density of 160 A/mm$^2$, and FIG. 5B shows a beta of around 8.6E−5 for the 30 volt device at the same current density.

FIGS. 6A and 6B are plots of the measured voltage drop across the diode versus diode current of two integrated low leakage diodes of the type shown in FIG. 1. FIG. 6A shows a forward voltage drop of around 1.01 volts for the 20 volt device at an anode current density of 160 A/mm$^2$, and FIG. 6B shows a forward voltage drop of around 1.04 volts for the 30 volt device at the same current density.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A diode formed integrally with a power integrated circuit on a substrate of a first conductivity type, comprising:
   a) an epitaxial layer of said first conductivity type formed on said substrate;
   b) a first region of a second conductivity type opposite said first conductivity type in said epitaxial layer separated from said substrate;
   c) a second region of said first conductivity type on above and contacting said first region such that a vertical parasitic transistor is formed spanning said epitaxial layer, said first region and said second region;
   d) a gate oxide on said epitaxial layer and a gate on said gate oxide;
   e) a channel region of said first conductivity type under said gate and which extends to a third region of said first conductivity type having a higher dopant concentration than said channel region;
   f) a fourth region of said second conductivity type contacting said channel region and said third region and is substantially aligned vertically with a first edge of said gate; said fourth region having a higher dopant concentration than said channel region;
   g) an anode terminal in contact with said gate, said third region, and said fourth region;
   h) a drift region of said second conductivity type extending from said channel region to a fifth region of said second conductivity type and a sixth region of said first conductivity type, said drift region having a lower dopant concentration than said fourth region, said fifth and sixth regions having higher dopant concentrations than said channel region;
   i) a cathode terminal in contact with said fifth and sixth regions; and j) a seventh region of said second conductivity type extending from said upper surface of said epitaxial layer downward to said first region which makes contact with said first and second regions and said third region, said seventh region having a higher dopant concentration than said first and second regions, said seventh region in contact with said anode terminal.

2. The diode of claim 1 wherein said fourth region, said channel region, and said drift region form a lateral transistor which becomes conductive when said anode voltage is greater than said cathode voltage by a predetermined amount.

3. The diode of claim 1 further including an eighth region of said first conductivity typed positioned between said drift region and said second region, said eighth region and said drift region forming a RESURF structure.

4. A diode formed integrally with a power integrated circuit on a substrate of a first conductivity type, comprising:
   a) an epitaxial layer of said first conductivity type formed on said substrate;
   b) a first region of a second conductivity type opposite said first conductivity type in said epitaxial layer separated from said substrate;
   c) a second region of said first conductivity type on above and contacting said first region such that a vertical parasitic transistor is formed spanning said epitaxial layer, said first region and said second region;
   d) a gate oxide on said epitaxial layer and a gate on said gate oxide;
   e) a channel region of said first conductivity type under said gate and which extends to a third region of said first conductivity type having a higher dopant concentration than said channel region;
   f) a fourth region of said second conductivity type contacting said channel region and said third region and is substantially aligned vertically with a first edge of said gate; said fourth region having a higher dopant concentration than said channel region;
   g) an anode terminal in contact with said gate, said third region, and said fourth region;
   h) a drift region of said second conductivity type extending from said channel region to a fifth region of said second conductivity type and a sixth region of said first conductivity type, said drift region having a lower dopant concentration than said fourth region, said fifth and sixth regions having higher dopant concentrations than said channel region;
   i) a cathode terminal in contact with said fifth and sixth regions; and
   j) an eighth region of said first conductivity type between and contacting said second region and said drift region.

5. The diode of claim 4 further including a ninth region of said second conductivity type contained inside said upper portion of said eighth region and approximately vertically aligned under said fifth and sixth regions.

6. The diode of claim 5 wherein said sixth region, said ninth region and said eighth region create a PNP transistor.

7. The diode of claim 5 wherein said ninth region is in contact with said drift region.

8. The diode of claim 5 wherein said drift region and said eighth region form a RESURF structure.

9. A diode formed integrally with a power integrated circuit on a substrate of a first conductivity type, comprising:
   a) an epitaxial layer of said first conductivity type formed on said substrate;
   b) a first region of a second conductivity type opposite said first conductivity type in said epitaxial layer separated from said substrate;
   c) a second region of said first conductivity type on above and contacting said first region such that a vertical parasitic transistor is formed spanning said epitaxial layer, said first region and said second region;
   d) a stepped gate oxide on said epitaxial layer having a thinner section and a thicker section;
   e) a gate on said stepped gate oxide overlapping both said thinner section and said thicker section of said gate oxide;
   f) a channel region of said first conductivity type under said thinner section of said stepped gate oxide and said gate which extends to a third region of said first conductivity type having a higher dopant concentration than said channel region;
   g) a fourth region of said second conductivity type contacting said channel region and said third region and is substantially aligned vertically with a first edge of said gate; said fourth region having a higher dopant concentration than said channel region;
   h) an anode terminal in contact with said gate, said third region, and said fourth region;
   i) a drift region of said second conductivity type extending from said channel region to a fifth region of said second conductivity type and a sixth region of said first conductivity type, said drift region having a lower dopant concentration than said fourth region, said fifth and sixth regions having higher dopant concentrations than said channel region; and
   j) a cathode terminal in contact with said fifth and sixth regions.

10. The diode of claim 9 wherein said gate region, said fourth region, said third region, said channel region, and said drift region form a lateral gate control NPN transistor with a hybrid MOS-bipolar mode which becomes conductive when said anode voltage is greater than said cathode voltage by a predetermined amount.

* * * * *